United States Patent
Oh et al.

(10) Patent No.: US 8,988,950 B2
(45) Date of Patent: Mar. 24, 2015

(54) DATA LOADING CIRCUIT AND SEMICONDUCTOR MEMORY DEVICE COMPRISING SAME

(71) Applicant: Samsung Electronics Co., Ltd., Suwon-Si, Gyeonggi-Do (KR)

(72) Inventors: Jong-Min Oh, Seoul (KR); Ho-Yong Song, Hwaseong-Si (KR); Seong-Jin Jang, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/056,370

(22) Filed: Oct. 17, 2013

(65) Prior Publication Data
US 2014/0104966 A1    Apr. 17, 2014

(30) Foreign Application Priority Data
Oct. 17, 2012    (KR) .......................... 10-2012-0115140

(51) Int. Cl.
| | | |
|---|---|---|
| G11C 19/00 | (2006.01) | |
| G11C 11/4093 | (2006.01) | |
| G11C 7/10 | (2006.01) | |
| G11C 8/04 | (2006.01) | |
| G11C 29/04 | (2006.01) | |

(52) U.S. Cl.
CPC ................ *G11C 8/04* (2013.01); *G11C 7/1036* (2013.01); *G11C 11/4093* (2013.01); *G11C 7/1051* (2013.01); *G11C 2207/107* (2013.01); *G11C 2029/0407* (2013.01)

USPC .................. 365/189.12; 365/189.05; 365/221

(58) Field of Classification Search
CPC ............... G11C 7/1036; G11C 7/1051; G11C 2029/0407; G11C 2207/107; G11C 11/4093
USPC ................................ 365/189.12, 221, 189.05
See application file for complete search history.

(56) References Cited

U.S. PATENT DOCUMENTS

| | | |
|---|---|---|
| 5,841,787 A | 11/1998 | Warring et al. |
| 6,188,092 B1 | 2/2001 | Hatano et al. |
| 6,430,016 B1 | 8/2002 | Marr |
| 6,727,726 B1 | 4/2004 | Plants |
| 7,203,842 B2 | 4/2007 | Kean |
| 2004/0004510 A1 | 1/2004 | Lehmann |
| 2007/0237009 A1 | 10/2007 | Lynch et al. |
| 2010/0034339 A1 | 2/2010 | Iwai |

FOREIGN PATENT DOCUMENTS

JP    1994231593 A    8/1994

*Primary Examiner* — Ly D Pham
(74) *Attorney, Agent, or Firm* — Volentine & Whitt, PLLC

(57) ABSTRACT

A data loading circuit comprises a non-volatile memory configured to store non-volatile data and output a serial data signal based on the stored non-volatile data in response to a power-up operation, a deserializer configured to receive the serial data signal and output multiple data bits at intervals of a unit period based on the received serial data signal, a load controller configured to generate multiple loading selection signals that are sequentially activated one-by-one at each interval of the unit period, and a loading memory unit configured to sequentially store the data bits at each interval of the unit period in response to the loading selection signals.

14 Claims, 12 Drawing Sheets

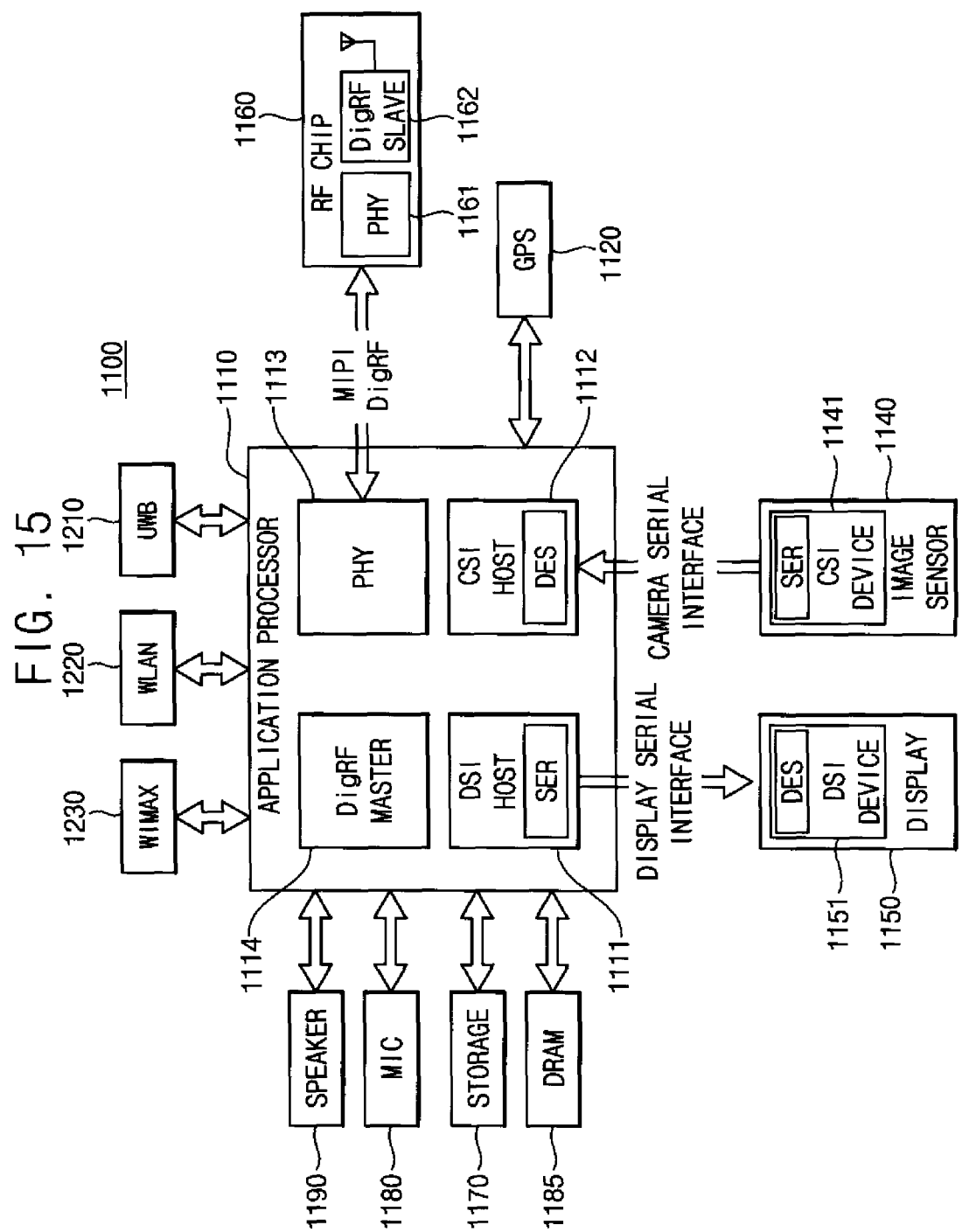

DATA LOADING CIRCUIT AND SEMICONDUCTOR MEMORY DEVICE COMPRISING SAME

CROSS-REFERENCE TO RELATED APPLICATIONS

This application claims priority under 35 USC §119 to Korean Patent Application No. 10-2012-0115140 filed on Oct. 17, 2012, the subject matter of which is hereby incorporated by reference.

BACKGROUND OF THE INVENTION

The inventive concept relates generally to semiconductor devices. Certain embodiments relate to a data loading circuit for a non-volatile memory device and a semiconductor memory device comprising the data loading circuit.

An electronic device may incorporate a non-volatile memory to store data when the device is powered off. In such a device, the data may be moved from the non-volatile memory to a volatile memory during a power-up operation to allow rapid access during operation of the device.

The volatile memory may be a main memory, or it may be some other type of memory. For example, where the data comprises fail addresses for repairing failed memory cells, the volatile memory may be a repair control circuit disposed near a memory cell array.

The repair control circuit typically comprises a shift register in which the fail addresses are loaded. In general, the shift register requires a master latch and a slave latch for storing one data bit and thus the shift register occupies a relatively large area. As the quantity of data to be loaded increases, the required area of the shift register tends to increase accordingly. As a result, the design margin of the electronic device may decrease as well.

SUMMARY OF THE INVENTION

In one embodiment of the inventive concept, a data loading circuit comprises a non-volatile memory configured to store non-volatile data and output a serial data signal based on the stored non-volatile data in response to a power-up operation, a deserializer configured to receive the serial data signal and output multiple data bits at intervals of a unit period based on the received serial data signal, a load controller configured to generate multiple loading selection signals that are sequentially activated one-by-one at each interval of the unit period, and a loading memory unit configured to sequentially store the data bits at each interval of the unit period in response to the loading selection signals.

In another embodiment of the inventive concept, a semiconductor memory device comprises a memory cell array comprising normal memory cells coupled to normal selection lines and redundancy memory cells coupled to redundancy selection lines, a decoder configured to select one of the normal selection lines based on an address of a read operation or a write operation, a non-volatile memory configured to store fail addresses indicating locations of fail memory cells among the normal memory cells, and further configured to output a serial data signal based on the stored fail addresses in response to a power-up operation, a load controller configured to generate multiple loading selection signals that are sequentially activated one-by-one at intervals of a unit period, and a repair control circuit configured to store the fail addresses sequentially based on the serial data signal and the loading selection signals, and further configured to select one of the redundancy selection lines with disabling the decoder when the address is identical to one of the stored fail addresses.

In yet another embodiment of the inventive concept, a method of operating a semiconductor device comprising a non-volatile memory and a data loading circuit comprises detecting a power-up operation of the semiconductor device, in response to the power-up operation, outputting, by the non-volatile memory, a serial data signal based on stored non-volatile data, deserializing the serial data signal and outputting multiple data bits at intervals of a unit period based on the received serial data signal, generating multiple loading selection signals that are sequentially activated one-by-one at each interval of the unit period, and sequentially storing the data bits at each interval of the unit period in a loading memory unit in response to the loading selection signals.

These and other embodiments of the inventive concept can potentially improve the efficiency of operations for loading data from a non-volatile memory to a volatile memory in response to a power-up operation of a semiconductor device.

BRIEF DESCRIPTION OF THE DRAWINGS

The drawings illustrate selected embodiments of the inventive concept. In the drawings, like reference numbers indicate like features.

FIG. 15 is a block diagram illustrating an interface for the computing system of FIG. 14.

DETAILED DESCRIPTION

Embodiments of the inventive concept are described below with reference to the accompanying drawings. These embodiments are presented as teaching examples and should not be construed to limit the scope of the inventive concept.

In the description that follows, the terms first, second, third, etc. may be used to describe various features, but these features should not be limited by these terms. Rather, these terms are used to distinguish between different features. Thus, a first feature discussed below could be termed a second feature and vice versa without materially changing the relevant teachings. As used herein, the term "and/or" includes any and all combinations of one or more of the associated listed items.

Where a feature is referred to as being "connected" or "coupled" to another feature, it can be directly connected or coupled to the other feature or intervening features may be present. In contrast, where a feature is referred to as being "directly connected" or "directly coupled" to another feature, there are no intervening features present. Other words used to describe the relationship between features should be interpreted in a like fashion (e.g., "between" versus "directly between," "adjacent" versus "directly adjacent," etc.).

The terminology used herein is for the purpose of describing example embodiments only and is not intended to limit the inventive concept. The singular forms "a," "an" and "the" are intended to include the plural forms as well, unless the context clearly indicates otherwise. Terms such as "comprises" and/or "comprising," where used in this description, indicate the presence of stated features but do not preclude the presence or addition of other features.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and will not be interpreted in an idealized or overly formal sense unless expressly so defined herein.

Figure 1:
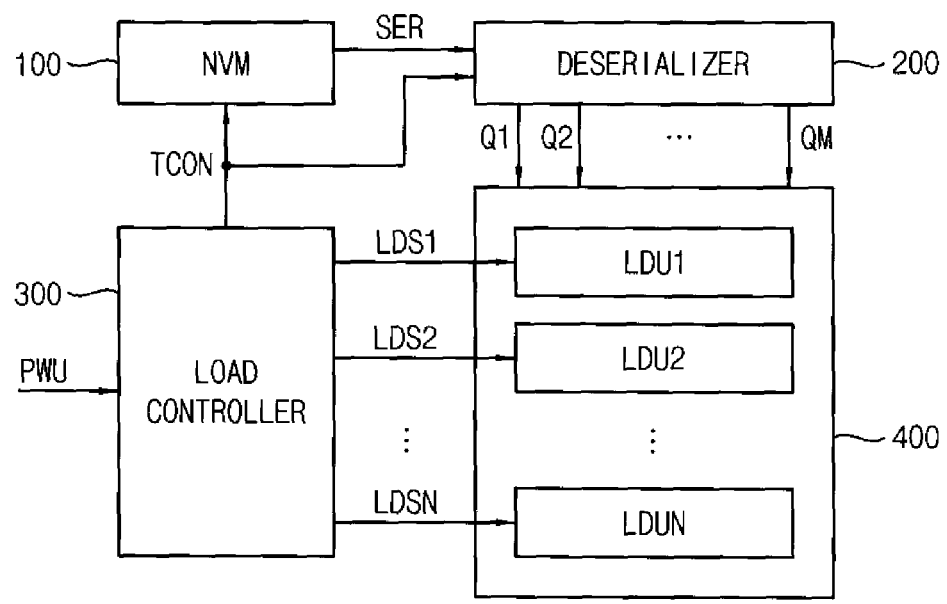
FIG. 1 is a block diagram illustrating a data loading circuit according to an embodiment of the inventive concept.

FIG. 1 is a block diagram illustrating a data loading circuit 10 according to an embodiment of the inventive concept.

Referring to FIG. 1, data loading circuit 10 comprises a non-volatile memory (NVM) 100, a deserializer 200, a load controller 300, and a loading memory unit 400.

Non-volatile memory 100 stores data in non-volatile fashion ("non-volatile data") and outputs a serial signal SER based on the stored non-volatile data in response to a power-up operation. The non-volatile memory may be any type of structure capable of retaining stored data when disconnected from power. For example, non-volatile memory 100 may comprise a fuse array, a flash memory, a phase-change random access memory (PRAM), a ferroelectric random access memory (FRAM), a resistance random access memory (RRAM), a magneto-resistive random access memory (MRAM), etc.

The non-volatile data stored in non-volatile memory 100 may be provided to deserializer 200 in the form of data bits in serial signal SER when power is provided to a device and/or a system comprising data loading circuit 10. An indication of a power-up operation may be provided, for instance, by a power-up signal PWU that is activated when a power supply voltage reaches a predetermined level.

Load controller 300 generates a control signal TCON for controlling and synchronizing operations of non-volatile memory 100 and deserializer 200. Control signal TCON comprises a transfer clock signal TCK and/or a mask signal MSK, which are further described with reference to FIGS. 2 through 8. Where power-up signal PWU is activated, load controller 300 launches a loading process for the non-volatile data using the control signal. Load controller 300 may be distinct from a processor such as a central processing unit CPU of the device comprising load controller 300. Load controller 300 typically comprises a logic circuit dedicated to controlling the loading process of the non-volatile data in response to the power-up operation. Load controller 300 may be disabled after the loading process is completed.

Figure 2:
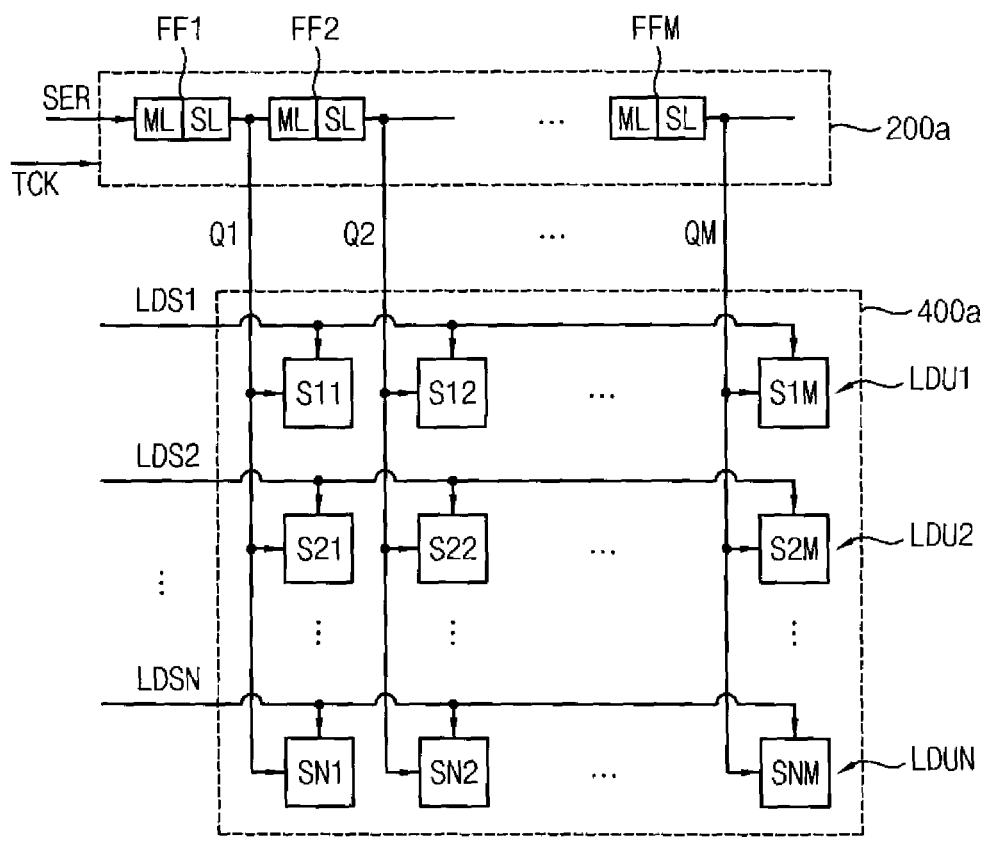
FIG. 2 is a diagram illustrating an example of a deserializer and a loading memory unit in the data loading circuit of FIG. 1.

Deserializer 200 receives serial signal SER from non-volatile memory 100 and provides multiple data bits at intervals of a unit period based on the received serial signal SER. Deserializer 200 is configured to store M data bits provided through serial signal SER. For example, deserializer 200 may be implemented with a shift register as illustrated in FIG. 2.

Load controller 300 generates multiple loading selection signals LDS1 through LDSN that are sequentially activated at the intervals of the unit period, and loading selection signals LDS1 through LDSN are provided to loading memory unit 400. In addition, as described above, load controller 300 may further generate control signal TCON for controlling and synchronizing operations of non-volatile memory 100 and deserializer 200. As will be described with reference to FIGS. 5, 7 and 8, transfer clock signal TCK may be in control signal TCON.

Loading memory unit 400 sequentially stores first through M-th data bits Q1 through QM, which are provided at intervals of the unit period, in response to loading selection signals LDS1 through LDSN.

Loading memory unit 400 comprises first through N-th loading units LDU1 through LDUN. Loading units LDU1 through LDUN receive first through N-th loading selection signals LDS1 through LDSN, respectively, so that loading units LDU1 through LDUN are enabled sequentially one-by-one at the intervals in response to loading selection signals LDS1 through LDSN. For example, first loading selection signal LDS1 may be activated during a first unit period, and first loading unit LDU1 may be enabled to store first through M-th data bits Q1 through QM in the first unit period. Second loading selection signal LDS2 may be activated during a second unit period and second loading unit LDU2 may be enabled to store first through M-th data bits Q1 through QM in the second unit period.

As such, loading selection signals LDS1 through LDSN may be sequentially activated one-by-one at intervals of the unit period, and the N*M data bits may be sequentially stored in loading units LDU1 through LDUN for N times the unit period.

FIG. 2 is a diagram illustrating an example of a deserializer and a loading memory unit in the data loading circuit of FIG. 1.

Referring to FIG. 2, the deserializer comprises a shift register circuit 200a. Shift register circuit 200a comprises M flip-flops FF1 through FFM or M registers that are cascade-coupled, where M is an integer greater than or equal to two, and the M data bits Q1 through QM are provided through output nodes of the M flip-flops FF1 through FFM. Here, the terms "cascade-coupled" or "cascaded" indicate that an output of a previous flip-flop is coupled to an input of a next flip-flop and thus flip-flops FF1 through FFN form a single chain. Each of the M flip-flops FF1 through FFM may comprise a master latch ML and a slave latch SL.

Shift register circuit 200a performs a shifting operation to store the M data bits provided in serial signal SER in response to transfer clock signal TCK. For example, the shifting operation of shift register circuit 200a and the outputting operation of non-volatile memory 100 in FIG. 1 may be synchronized with each other based on transfer clock signal TCK.

Loading memory unit 400a comprises N*M one-bit storage elements S11 through SNM for storing the N*M data bits that are provided in serial signal SER for N times the unit period. As described above, one-bit storage elements S11 through SNM may be grouped into the N loading units LDU1 through LDUN. First loading unit LDU1 comprises M one-bit storage elements S11 through S1M of the first row, second loading unit LDU2 comprises M one-bit storage elements S21 through S2M of the second row, and in this way N-th loading unit LDUN comprises M one-bit storage elements SN1 through SNM of the N-th row.

The output nodes of flip-flops FF1 through FFM in shift register circuit 200a are commonly coupled to loading units LDU1 through LDUN. Where first loading selection signal LDS1 is activated, one-bit storage elements S11 through S1M in first loading unit LDU1 are enabled to store data bits Q1 through QM of the first unit period. Where second loading selection signal LDS2 is activated, one-bit storage elements S21 through S2M in second loading unit LDU2 are enabled to store data bits Q1 through QM of the second unit period. In this way, one-bit storage elements SN1 through SNM in N-th loading unit LDUN are enabled, where N-th loading selection signal LDSN is activated, to store data bits Q1 through QM of the N-th unit period. As such, shift register circuit 200a receives and stores the M data bits periodically, and loading memory unit 400a stores the N*M data bits sequentially in response to the N loading selection signals LDS1 through LDSN that are sequentially activated.

Figure 3:
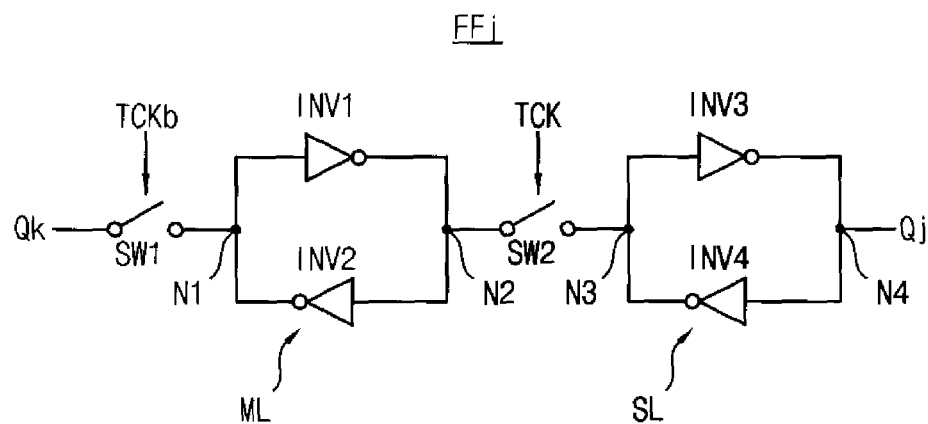
FIG. 3 is a circuit diagram illustrating an example one-bit storage unit of the deserializer in FIG. 2.
Figure 4:
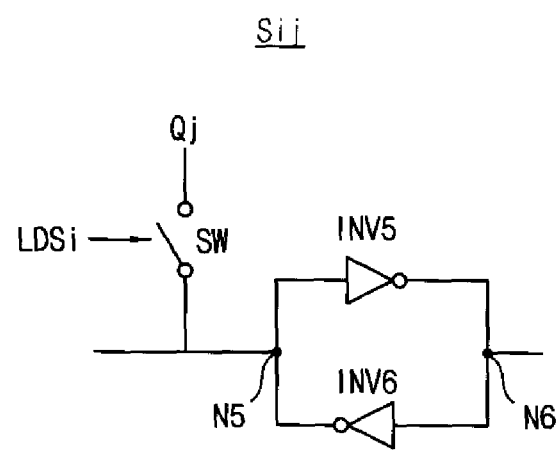
FIG. 4 is a circuit diagram illustrating an example one-bit storage unit of the loading memory unit in FIG. 2.

FIG. 3 is a circuit diagram illustrating an example one-bit storage unit of the deserializer in FIG. 2, and FIG. 4 is a circuit diagram illustrating an example one-bit storage unit of the loading memory unit in FIG. 2.

Referring to FIG. 3, a one-bit storage element, i.e., a flip-flop FFj or a register in shift register circuit 200a in FIG. 2, comprises a master latch ML and a slave latch SL. Master latch ML comprises two inverters INV1 and INV2 that are coupled between two nodes N1 and N2 with inputs and outputs crossed, and slave latch SL comprises two inverters INV3 and INV4 that are coupled between two nodes N3 and N4 with inputs and outputs crossed.

Master latch ML latches data bit Qk transferred from a previous flip-flop through a first switch SW1 which is turned-on in response to an inverted transfer clock signal TCKb, and slave latch SL latches the data bit output from master latch ML through a second switch SW2 which is turned-on in response to a transfer clock signal TCK. In alternative embodiments, first switch SW1 may be turned-on in response to transfer clock signal TCK, and second switch SW2 may be turned-on in response to the inverted transfer clock signal TCKb.

Using the cascade-coupled M flip-flops as illustrated in FIG. 3, one-bit shifting may be performed per the cyclic period of transfer clock signal TCK, and M-bit shifting may be performed for the M cyclic periods. The cyclic period of transfer clock signal TCK may correspond to the above-mentioned unit period and thus shift register circuit 200a may store the M data bits Q1 through QM that are provided in serial signal SER for N times the unit period.

Referring to FIG. 4, a one-bit storage element Sij in loading memory unit 400 of shift register circuit 200a in FIG. 2 comprises a latch. The latch comprises two inverters INV5 and INV6 that are coupled between two nodes N5 and N6 with inputs and outputs crossed. The latch latches data bit Qj transferred through a switch SW, which is turned-on in response to corresponding loading selection signal LDSi. Data bit Qj is transferred from the output node of the corresponding flip-flop FFj in shift register circuit 200a.

As illustrated in FIGS. 3 and 4, one-bit storage element FFj in shift register circuit 200a occupies about twice as much area as one-bit storage element Sij in loading memory unit 400a. FIG. 4 illustrates a non-limiting example of the one-bit storage element Sij having the smaller area. One-bit storage element Sij in loading memory unit 400a can be implemented with various storage structures other than the latch.

In a less effective approach, all of the data bits of the non-volatile data are loaded in the shift register circuit. Where the N*M data bits are loaded, the N*M flip-flops, each comprising the master and slave latches, have to be in the shift register circuit. The master latches are required to prevent errors of the shifting operation and the slave latches function as the substantial storage to store the data bits. Where all of the data bits are loaded in the shift register circuit after the last one-bit shifting is performed, the master latches need not operate and occupy areas unnecessarily. Thus the master devices act as a size penalty in a device performing the loading process according to the less effective approach, a significant penalty for a high-density device, especially one having insufficient design margin.

Compared to the less effective approach, data loading circuit 10 reduces the number of storage elements in shift register circuit 200a having a relatively large area, and it stores the data bits in loading memory unit 400a having a relatively smaller area. As described above, to load the N*M data bits, data loading circuit 10 stores the N*M data bits by performing, N times repeatedly, the shifting operation for temporarily storing the M data bits using the M flip-flops, and the loading operation for storing the M data bits in the loading memory.

As a result, the data loading circuit may be implemented with a reduced area, and such down-sizing effect may be increased as the number of data bits of the non-volatile data to be loaded is increased.

Figure 5:
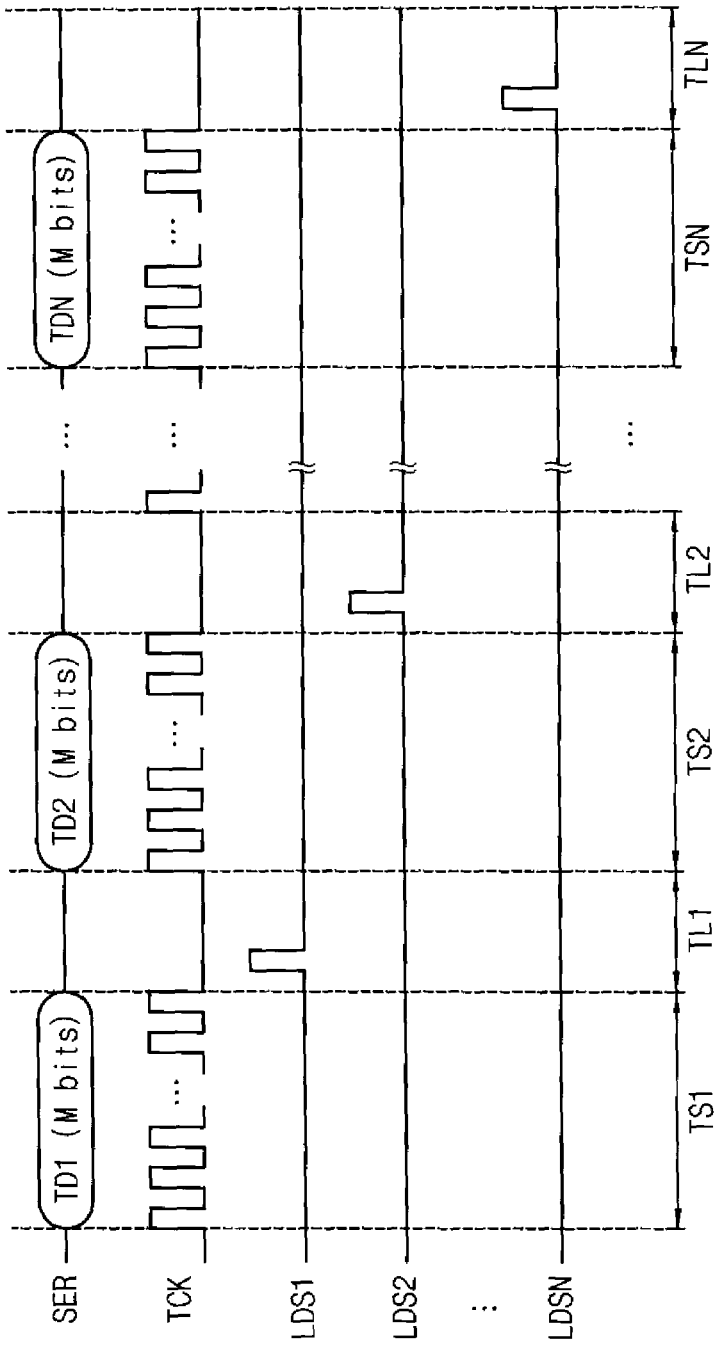
FIG. 5 is a timing diagram illustrating an operation of a data loading circuit according to an embodiment of the inventive concept.

FIG. 5 is a timing diagram illustrating operations of a data loading circuit according to an embodiment of the inventive concept.

Referring to FIG. 5, the above-mentioned unit period may comprise a shifting period TSi and a loading period TLi (i=1, 2, . . . , or N). Transfer clock signal TCK is activated during shifting period TSi and deactivated during loading period TLi. Loading selection signals LDS1 through LDSN are activated sequentially one-by-one during loading periods TL1 through TLN.

Referring to FIGS. 2 and 5, shift register circuit 200a performs the shifting operation to store the M data bits TDi in synchronization with transfer clock signal TCK during shifting period TSi. Loading memory unit 400a receives and stores the M data bits TDi from shift register circuit 200a during loading period TLi.

First data TD1 of M bits is temporarily stored in shift register circuit 200a in response to transfer clock signal TCK during first shifting period TS1, and first loading selection signal LDS1 is activated to store first data TD1 in first loading unit LDU1 during the first loading period TL1. Second data TD2 of M bits is temporarily stored in shift register circuit 200a in response to transfer clock signal TCK during the second shifting period TS2, and second loading selection signal LDS2 is activated to store second data TD2 in second loading unit LDU2 during second loading period TL2. In this way, N-th data TDN of M bits is temporarily stored in shift register circuit 200a in response to transfer clock signal TCK during N-th shifting period TSN, and N-th loading selection signal LDSN is activated to store the N-th data TDN in N-th loading unit LDUN during N-th loading period TLN.

As a result, the N*M data bits in first through N-th data TD1 through TDN are stored in loading memory unit 400a by repeating N times the shifting operation and the loading operation with respect to the M data bits.

Figure 6:
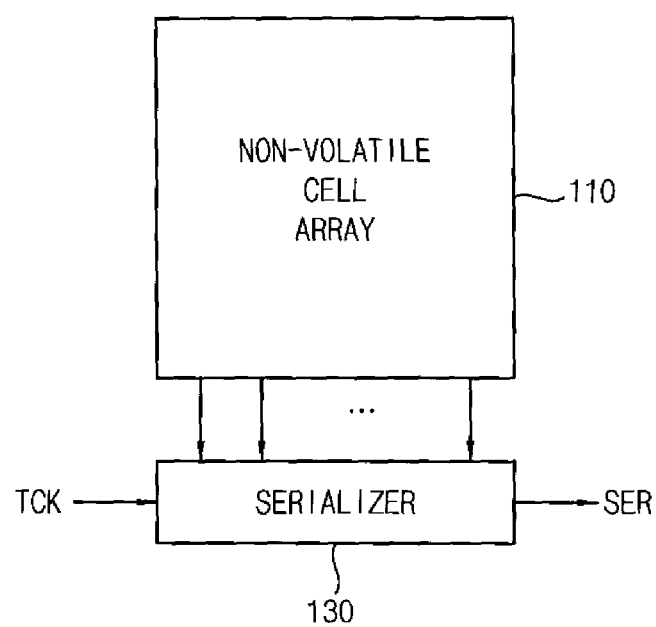
FIG. 6 is a diagram illustrating an example of a non-volatile memory in the data loading circuit of FIG. 1.

FIG. 6 is a diagram illustrating an example of non-volatile memory 100 in the data loading circuit of FIG. 1.

Referring to FIG. 6, non-volatile memory 100 comprises a non-volatile cell array 110 and a serializer 130. Non-volatile cell array 110 stores non-volatile data and serializer 130 generates serial signal SER based on the stored non-volatile data.

Non-volatile cell array 110 comprises multiple memory cells of various types. For example, the memory cell may comprise a fuse cell, a flash memory cell, a PRAM cell, an FRAM cell, an RRAM cell, an MRAM cell, etc. In some embodiments, non-volatile cell array 110 may be a fuse array comprising multiple fuse cells having relatively simple programming or writing means. The fuse cell may be an electric fuse cell that is programmed by cutting a conduction path of a metal-oxide semiconductor (MOS) transistor, or an anti-fuse cell that is programmed by forming a conduction path in a MOS capacitor with a breakdown therein.

Serializer 130 serializes non-volatile data from non-volatile cell array 110 to produce serial signal SER. Serializer 130 performs an output operation of serial signal SER in synchronization with transfer clock signal TCK. Transfer clock signal TCK is provided in common to serializer 130 and the above-described shift register circuit 200a. The shifting operation of shift register circuit 200a and the output operation of non-volatile memory 100 are synchronized based on transfer clock signal TCK.

Figure 7:
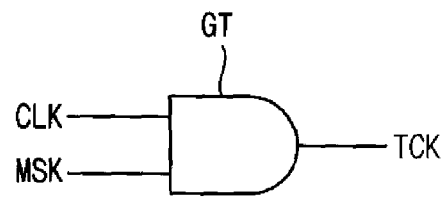
FIG. 7 is a diagram for describing an example of generating a transfer clock signal used in a data loading circuit according to an embodiment of the inventive concept.
Figure 8:
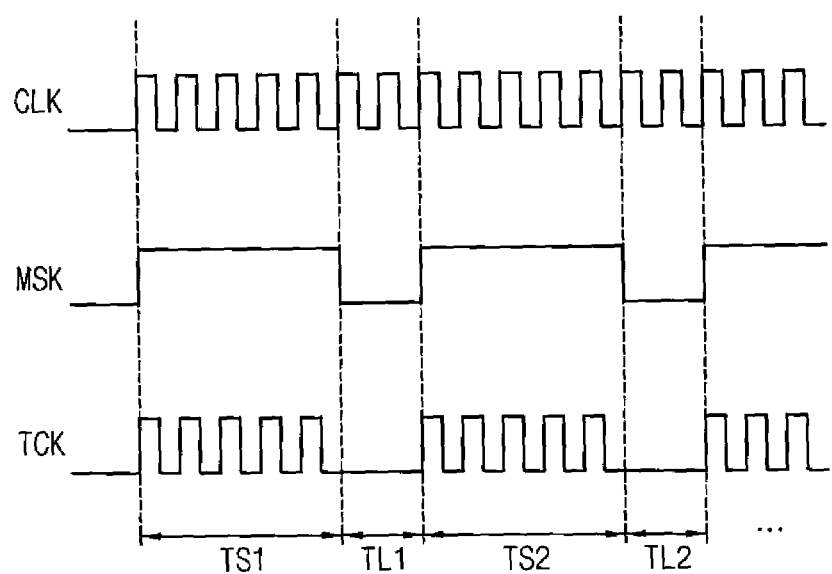
FIG. 8 is another diagram for describing the example of generating the transfer clock signal used in a data loading circuit according to an embodiment of the inventive concept.

FIGS. 7 and 8 are diagrams for describing an example of generating a transfer clock signal used in a data loading circuit according to an embodiment of the inventive concept.

Referring to FIGS. 7 and 8, transfer clock signal TCK is generated using a logic gate GT to perform a logical operation on a clock signal CLK and a mask signal MSK. For example, logic gate GT may be an AND gate performing an AND logic operation. In this case, transfer clock signal TCK is activated while the mask signal is in a logic "high" level and deactivated while the mask signal is in a logic "low" level. In other words, transfer clock signal TCK may be activated during the above-described shifting period TSi and deactivated during the above-described loading period TLi. Each of shifting period TSi and loading period TLi may be determined by the cycle number of transfer clock signal TCK. For example, where shift register circuit 200a comprises the M flip-flops and one-bit shifting is performed per cycle of transfer clock signal TCK, shifting period TSi may correspond to the M cyclic periods of transfer clock signal TCK. Loading period TLi may be determined properly considering the data transfer from shift register circuit 200a to loading memory unit 400a.

In some embodiments, load controller 300 in FIG. 1 comprises logic gate GT as illustrated in FIG. 7 to generate transfer clock signal TCK, and transfer clock signal TCK may be provided in common to serializer 130 in non-volatile memory 100 and the deserializer such as a shift register circuit 200a. In this case, the shifting operation of shift register circuit 200a and the output operation of non-volatile memory 100 may be performed in synchronization based on transfer clock signal TCK from load controller 300.

In some other embodiments, each of non-volatile memory 100 and shift register circuit 200a may comprise logic gate GT as illustrated in FIG. 7. Load controller 300 in FIG. 1 may provide, as one of control signal TCON, mask signal MSK commonly to non-volatile memory 100 and shift register circuit 200a, each of non-volatile memory 100 and shift register circuit 200a may generate the respective transfer control signal TCK. In this case, the shifting operation of shift register circuit 200a and the output operation of non-volatile memory 100 may be synchronized based on mask signal MSK from load controller 300.

Figure 9:
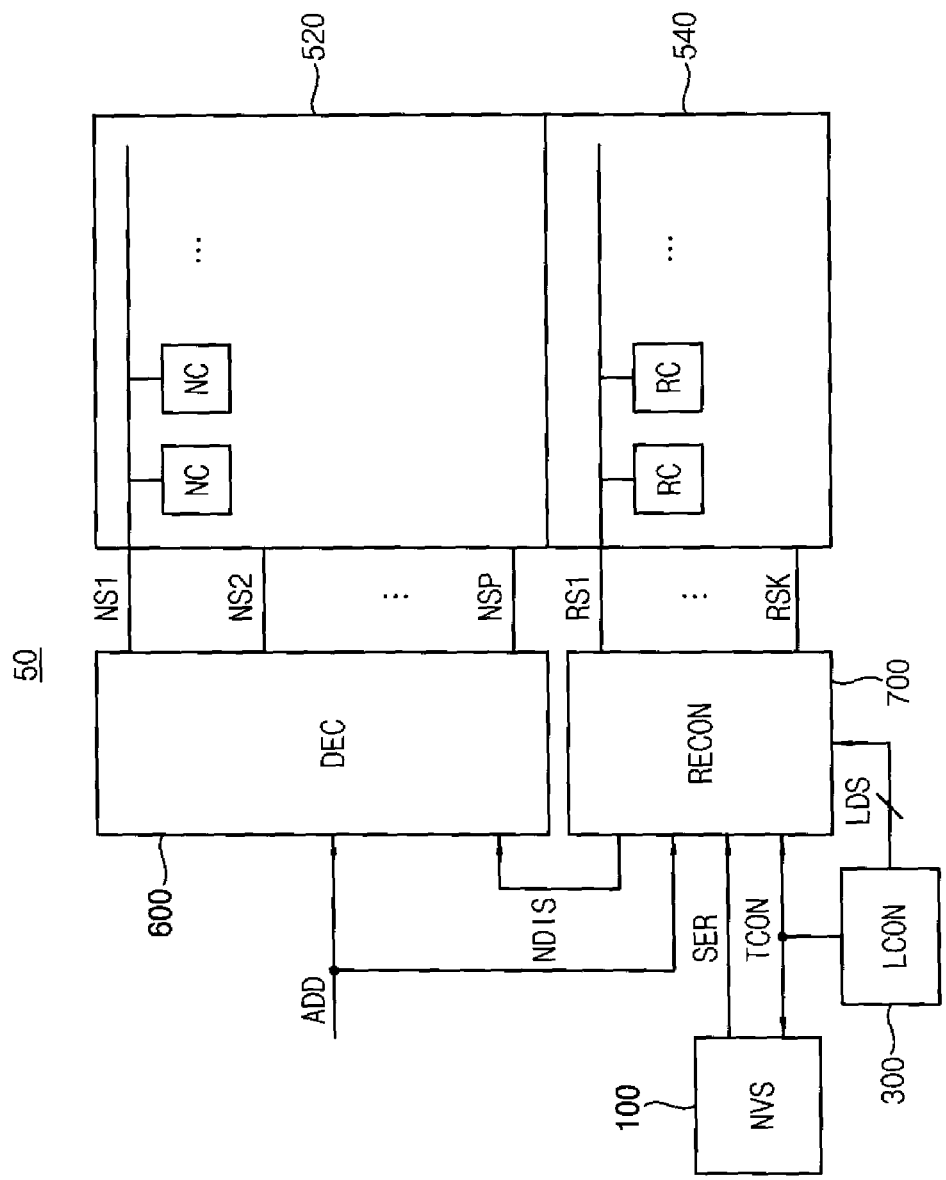
FIG. 9 is a block diagram illustrating a semiconductor memory device according to an embodiment of the inventive concept.

FIG. 9 is a block diagram illustrating a semiconductor memory device 50 according to an embodiment of the inventive concept.

Referring to FIG. 9, semiconductor memory device 50 comprises a memory cell array 520 and 540, a decoder (DEC) 600, non-volatile memory 100, load controller 300 and a repair control circuit (RECON) 700. In FIG. 9, components unrelated with descriptions of the loading process of the non-volatile data are omitted.

Memory cell array 520 and 540 comprises is divided into normal memory cell array 520 and redundancy memory cell array 540. Normal cell array 520 comprises multiple normal memory cells NCs coupled to normal selection lines NS1 through NSP, and redundancy memory cell array 540 comprises multiple redundancy memory cells RCs coupled to redundancy selection lines RS1 through RSK.

Decoder 600 selects one of normal selection lines NS1 through NSP based on an address ADD for a read operation or a write operation. By selecting the normal selection line, the read operation or the write operation may be performed with respect to the normal memory cells coupled to the selected one of normal selection lines NS1 through NSP.

Non-volatile memory 100 stores fail addresses indicating locations of fail memory cells among the normal memory cells NCs, and outputs a serial signal SER based on the stored fail addresses when semiconductor memory device 50 is powered-up. The fail addresses may be obtained and stored in non-volatile memory 100 through test processes of semiconductor memory device 50. Load controller 300 generates multiple loading selection signals LDS that are sequentially activated one-by-one at an interval of a unit period. The configurations and operations of non-volatile memory 100 and load controller 300 may be the same as described with reference to FIGS. 1 through 8, and the repeated description may be omitted.

Repair control circuit 700 stores or loads the fail addresses sequentially based on serial signal SER and loading selection signals LDS. Repair control circuit 700 controls a repair operation for replacing an access to the normal memory cells NCs with an access to the redundancy memory cells RCs when input address ADD is identical to one of the stored fail addresses. Repair control circuit 700 selects one of redundancy selection lines RS1 through RSK with disabling decoder 600 by activating a disable signal NDIS, when input address ADD is identical to one of the stored fail addresses.

In some embodiments, normal selection lines NS1 through NSP and redundancy selection lines RS1 through RSK are wordlines. In such embodiments, repair control circuit 700 may perform the repair operation wordline by wordline. Where each wordline stores multiple pages, repair control circuit 700 may perform the repair operation page by page. In some other embodiments, normal selection lines NS1 through NSP and redundancy selection lines RS1 through RSK are bitlines. In such embodiments, repair control circuit 700 performs repair operations bitline by bitline.

Figure 10:
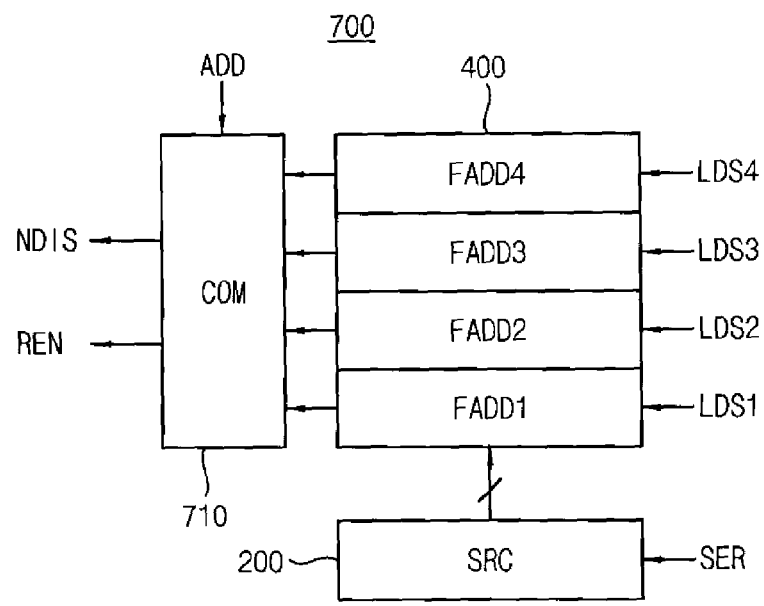
FIG. 10 is a block diagram illustrating an example of a repair control circuit in the semiconductor memory device of FIG. 9.

FIG. 10 is a block diagram illustrating an example of repair control circuit 700 in semiconductor memory device 50 of FIG. 9.

Referring to FIG. 10, repair control circuit 700 comprises deserializer 200, loading memory unit 400, and a comparator (COM) 710.

Deserializer 200 receives serial signal SER and provides multiple data bits at the intervals of the unit period based on the received serial signal SER. As described above, the deserializer may comprise M flip-flops that are cascade-coupled as illustrated in FIG. 2, and the M flip-flops form the shift register circuit SRC to provide the M data bits through output nodes of the M flip-flops.

Loading memory unit 400 may sequentially store the data bits at the interval of the unit period in response to loading selection signals LDS1 through LDS40. FIG. 10 illustrates four fail addresses FADD1 through FADD4 loaded based on the four loading selection signals LDS1 through LDS4 for convenience of illustration and description, but the number of the loading selection signals may be changed according to the total data bits to be loaded.

As described above, loading memory unit 400 may have a storage capacity for the M*N data bits that are provided from deserializer 200 for N times the unit period. Depending on the number of the flip-flops in the shift register circuit SRC, only a portion of the data bits corresponding to the one fail address be loaded in loading memory unit 400 whenever the one loading selection signal is activated, or the data bits corresponding to the two or more fail addresses may be loaded simultaneously in loading memory unit 400 whenever the one loading selection signal is activated.

Comparator 710 compares input address ADD with the stored fail addresses FADD1 through FADD4. Based on the comparison, comparator 710 generates disable signal NDIS for disabling decoder 600 in FIG. 9 and redundancy enable signal REN for selecting one of redundancy selection lines RS1 through RSK.

Figure 11:
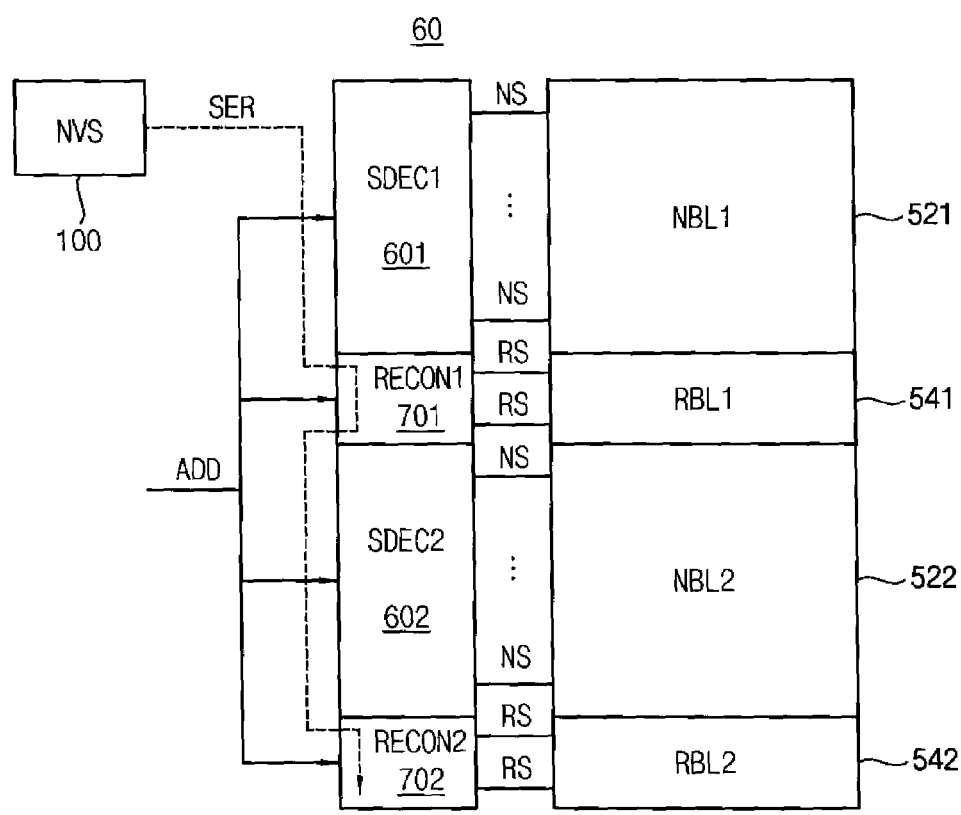
FIG. 11 is a block diagram illustrating a semiconductor memory device according to another embodiment of the inventive concept.

FIG. 11 is a block diagram illustrating a semiconductor memory device 60 according to another embodiment of the inventive concept. Semiconductor memory device 60 has certain features in common with semiconductor memory device 50 of FIG. 9, and a repeated description of those features will be omitted to avoid redundancy.

Comparing semiconductor memory device 60 of FIG. 11 with semiconductor memory device 50 of FIG. 9, normal memory cell array 520 of FIG. 9 is divided into multiple normal blocks 521 and 522. Although FIG. 11 illustrates a first normal block (NBL1) 521 and a second normal block (NBL2) 522 for convenience of illustration, normal cell array 520 may be divided into three or more normal blocks.

According to the division of normal memory cell array 520 in first normal block 521 and second normal block 522, redundancy memory cell array 540 is divided into a first redundancy block (RBL1) 541 and a second redundancy block (RBL2) 542, decoder 600 is divided into a first sub decoder (SDEC1) 601 and a second sub decoder (SDEC2) 602, repair control circuit 700 is divided into a first sub repair control circuit (RECON1) 701 and a second sub repair control circuit (RECON2) 702. Although FIG. 11 illustrates a layout in which the redundancy block is disposed at a bottom portion of the corresponding normal block, the redundancy block may be disposed in various alternative locations. For example, the redundancy block may be disposed at an upper portion of the corresponding normal block, or it may be distributed between the bottom and upper portions of the corresponding normal block.

As such, repair control circuit 700 in FIG. 9 may be divided into sub repair control circuits 701 and 702 that are disposed spatially apart from each other as illustrated in FIG. 11, and the M flip-flops and the loading memory unit may be distributed in sub repair control circuits 701 and 702.

The transfer path of the data bits in serial signal SER is represented by a dashed line in FIG. 11. As described with reference to FIG. 12, the flip-flops in first sub repair control circuit 701 and the flip-flops in second sub repair control circuit 702 may be cascade-coupled in their entirety to form a single shift register circuit.

Figure 12:
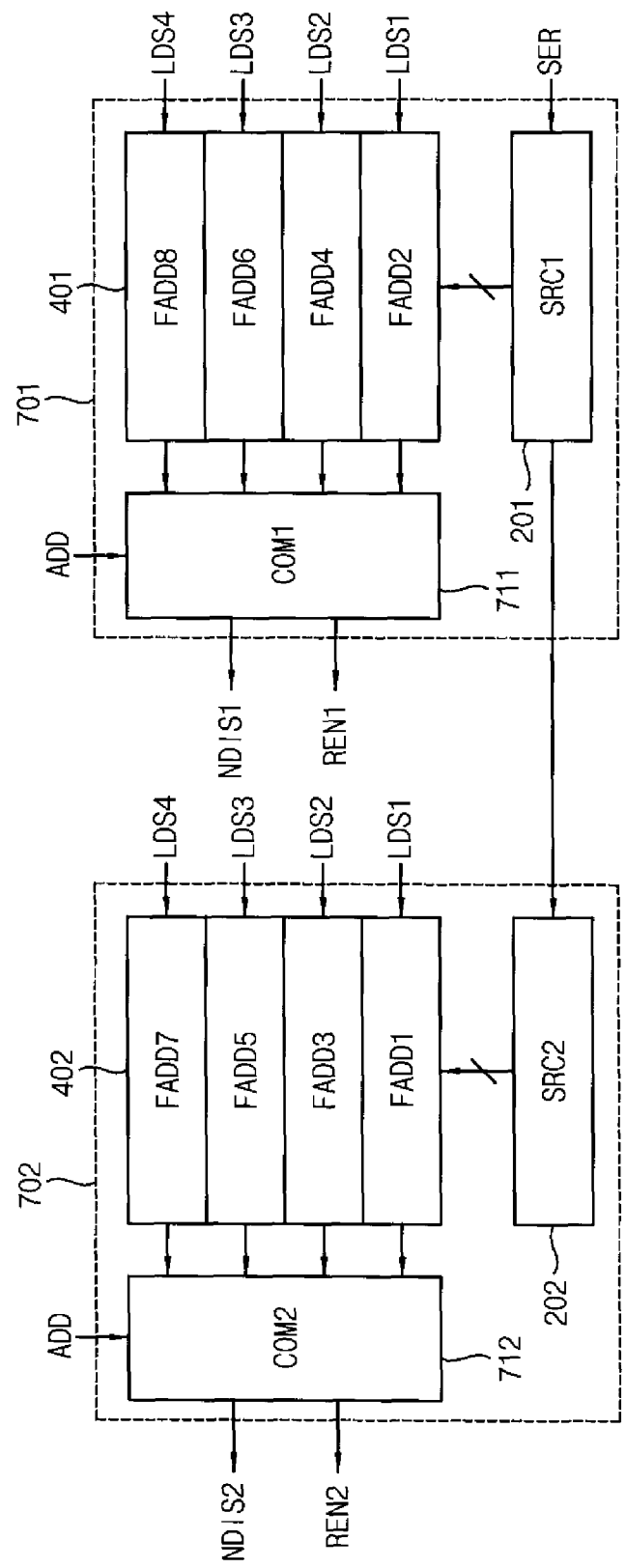
FIG. 12 is a block diagram illustrating an example of a repair control circuit in the semiconductor memory device of FIG. 11.

FIG. 12 is a block diagram illustrating an example of a repair control circuit in semiconductor memory device 60 of FIG. 11.

Referring to FIG. 12, first sub repair control circuit 701 comprises a first shift register circuit (SRC1) 201, a first loading memory (401) and a first comparator (COM1) 711, and second sub repair control circuit 702 comprises a second shift register circuit (SRC2) 202, a second loading memory (402) and a second comparator (COM2) 712.

As illustrated in FIG. 12, the output of first shift register circuit 201 is coupled to the input of second shift register circuit 202. In this case, first shift register circuit 201 and second shift register circuit 202 form a single coupled shift register circuit 201 and 202 for performing a shifting operation in their entirety.

Coupled shift register circuit 201 and 202 provide multiple data bits at the interval of the unit period based on the received serial signal SER. As described above, coupled shift register circuit 201 and 202 may comprise the M flip-flops and the M data bits may be provided through the output nodes of the M flip-flops at the interval of the unit period.

Loading memories 401 and 402 distributed in the first and second sub repair control circuits 701 and 702 may sequentially store the M data bits at the interval of the unit period in response to loading selection signals LDS1 through LDSN. Although FIG. 12 illustrates eight fail addresses FADD1 through FADD8 loaded based on four loading selection signals LDS1 through LDS4 for convenience of illustration and description, the number of the loading selection signals may be changed according to the total data bits to be loaded. As described above, loading memories 401 and 402 may have a storage capacity for the M*N data bits that are provided from coupled shift register circuit 201 and 202 for N times the unit period.

First comparator 711 compares input address ADD with fail addresses FADD2, FADD4, FADD6 and FADD8 stored in first loading memory unit 401. Based on the comparison, first comparator 711 generates the first disable signal NDIS1 for disabling first sub decoder 601 in FIG. 11 and the first redundancy enable signal REN1 for selecting one of the redundancy selection lines RSs coupled to first redundancy block 541 in FIG. 11. Second comparator 712 compares input address ADD with fail addresses FADD1, FADD3, FADD5 and FADD7 stored in second loading memory unit 402. Based on the comparison, second comparator 712 generates the second disable signal NDIS2 for disabling second sub decoder 602 in FIG. 11 and the second redundancy enable signal REN2 for selecting one of the redundancy selection lines RSs coupled to second redundancy block 542 in FIG. 11.

Figure 13:
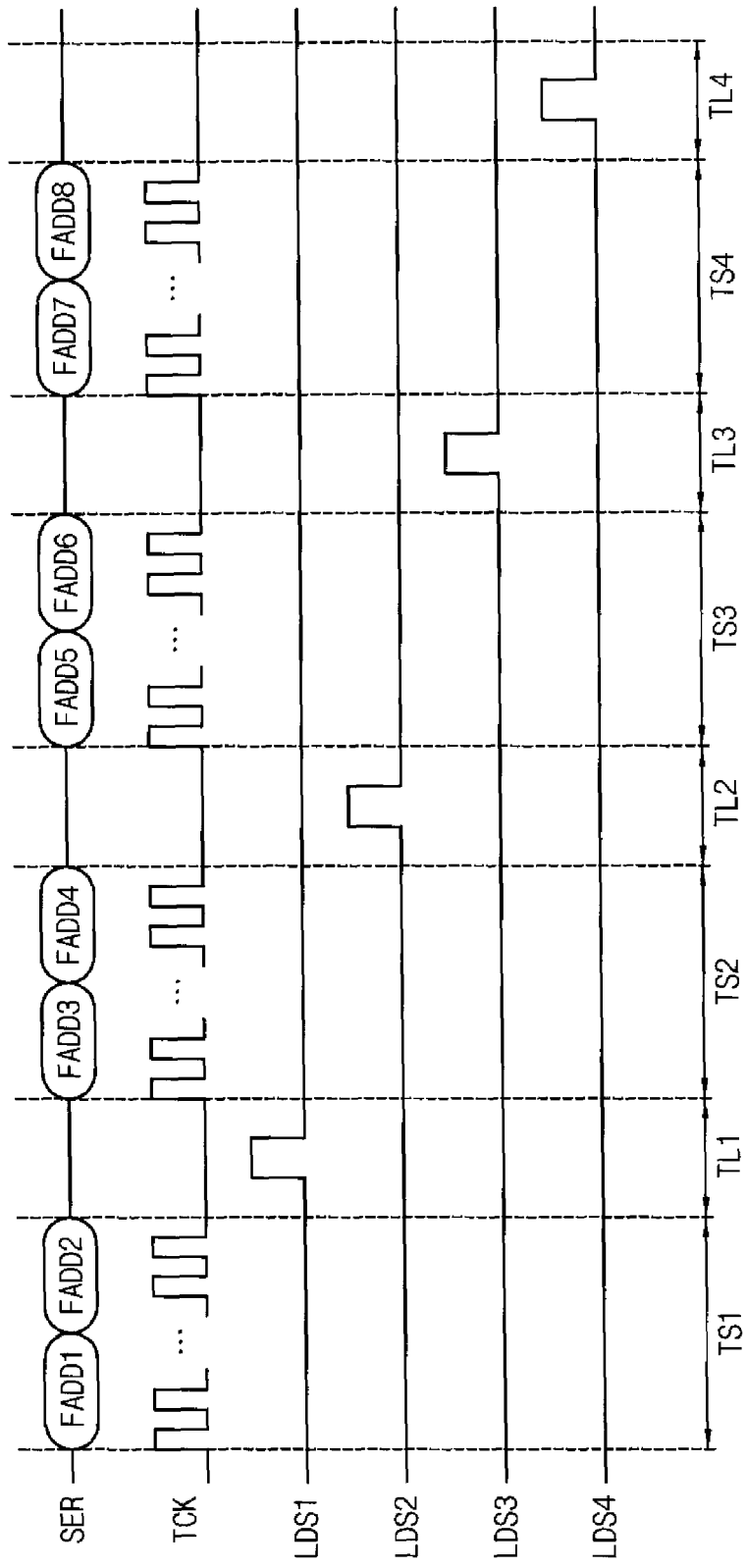
FIG. 13 is a timing diagram illustrating an operation of the repair control circuit of FIG. 12.

FIG. 13 is a timing diagram illustrating an operation of the repair control circuit of FIG. 12.

Referring to FIG. 13, a unit period comprises a shifting period TSi and a loading period TLi (i=1, 2, 3 or 4). Transfer clock signal TCK is activated during shifting period TSi and deactivated during loading period TLi. Loading selection signals LDS1 through LDS4 are activated sequentially one-by-one during loading periods TL1 through TL4.

Referring to FIGS. 11, 12 and 13, coupled shift register circuit 201 and 202 performs the shifting operation to store the M data bits TDi in synchronization with transfer clock signal TCK during shifting period TSi and loading memories 401 and 402 receive and store the M data bits TDi from coupled shift register circuit 201 and 202 during loading period TLi.

First fail address FADD1 and second fail address FADD2 of the M data bits in total are stored respectively in the first and second shift register circuits 201 and 202 in response to transfer clock signal TCK during first shifting period TS1, and then first loading selection signal LDS1 is activated to store the first fail address FADD1 and the second fail address FADD2 in first and second loading memories 401 and 402 during first loading period TL1.

Third fail address FADD3 and fourth fail address FADD4 of the M data bits in total are stored respectively in first and second shift register circuits 201 and 202 in response to transfer clock signal TCK during second shifting period TS2, and then second loading selection signal LDS2 is activated to store third fail address FADD3 and fourth fail address FADD4 in first and second loading memories 401 and 402 during second loading period TL2.

Fifth fail address FADD5 and sixth fail address FADD6 of the M data bits in total are stored respectively in first and second shift register circuits 201 and 202 in response to transfer clock signal TCK during third shifting period TS3, and then third loading selection signal LDS3 is activated to store fifth fail address FADD5 and sixth fail address FADD6 in first and second loading memories 401 and 402 during third loading period TL3.

Seventh fail address FADD7 and eighth fail address FADD8 of the M data bits in total are stored respectively in first and second shift register circuits 201 and 202 in response to transfer clock signal TCK during fourth shifting period TS4, and then fourth loading selection signal LDS4 is activated to store seventh fail address FADD7 and eighth fail address FADD8 in first and second loading memories 401 and 402 during fourth loading period TL4.

As such, the N*M data bits in the fail addresses are stored in loading memories 401 and 402 by repeating N times the shifting operation and the loading operation with respect to the M data bits.

Figure 14:
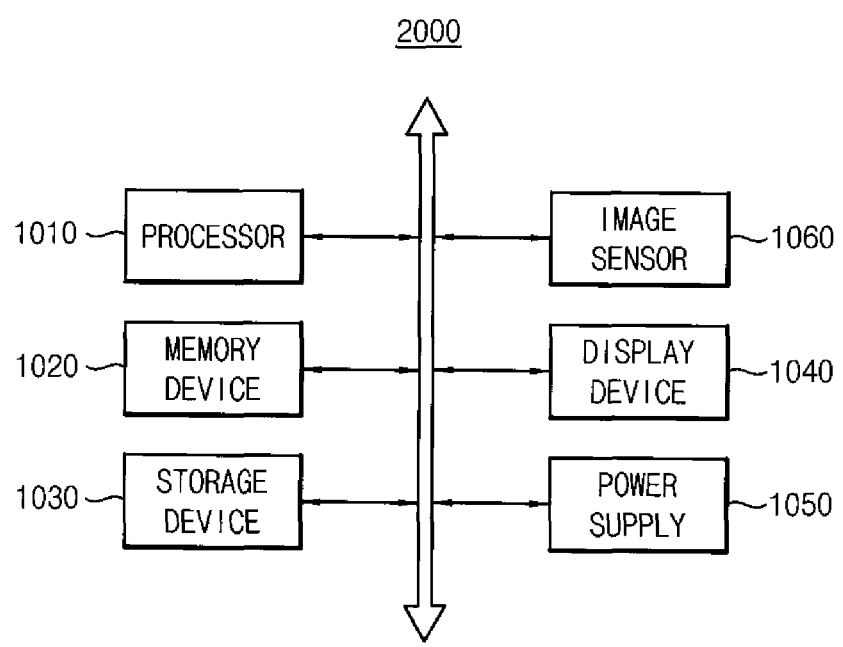
FIG. 14 is a block diagram illustrating a computing system comprising a semiconductor memory device according to an embodiment of the inventive concept.

FIG. 14 is a block diagram illustrating a computing system 2000 comprising a semiconductor memory device according to an embodiment of the inventive concept.

Referring to FIG. 14, computing system 2000 comprises a processor 1010, a memory device 1020, a storage device 1030, a display device 1040, a power supply 1050 and an image sensor 1060. Although not illustrated in FIG. 14, computing system 2000 may further comprise ports that communicate with a video card, a sound card, a memory card, a USB device, other electronic devices, etc.

Processor 1010 performs various calculations or tasks. According to some embodiments, processor 1010 may be a microprocessor or a CPU. Processor 1010 may communicate with memory device 1020, storage device 1030, and display device 1040 via an address bus, a control bus, and/or a data bus. In some embodiments, processor 1010 may be coupled to an extended bus, such as a peripheral component interconnection (PCI) bus. Memory device 1020 stores data for operating computing system 2000. Memory device 1020 may comprise, for instance, a dynamic random access memory (DRAM) device, a mobile DRAM device, a static random access memory (SRAM) device, a PRAM device, an FRAM device, an RRAM device, and/or an MRAM device. Memory device 1020 comprises the data loading circuit according to example embodiments as described with reference to FIGS. 1 through 13.

Storage device 1030 may comprise a solid state drive (SSD), a hard disk drive (HDD), a CD-ROM, etc. Computing system 2000 may further comprise an input device such as a touchscreen, a keyboard, a keypad, a mouse, etc., and an output device such as a printer, a display device, etc. power supply 1050 supplies operation voltages for computing system 2000.

Image sensor 1060 may communicate with processor 1010 via the buses or other communication links. Image sensor 1060 can be integrated with processor 1010 in one chip, or image sensor 1060 and processor 1010 may be implemented as separate chips.

At least a portion of computing system 2000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). Computing system 2000 may be a computing system using a data loading circuit, e.g., a digital camera, a mobile phone, a smart phone, a portable multimedia player (PMP), a personal digital assistant (PDA), a computer, etc.

FIG. 15 is a block diagram illustrating an interface for computing system 1100 of FIG. 14.

Referring to FIG. 15, computing system 1100 may comprise a data processing device that uses or supports a mobile industry processor interface (MIPI) interface. Computing system 1100 may comprise an application processor 1110, an image sensor 1140, a display device 1150, etc. display device 1150 may comprise the source driver according to certain embodiments as described with reference to FIGS. 10 and 11. A CSI host 1112 of application processor 1110 may perform a serial communication with a CSI device 1141 of image sensor 1140 via a camera serial interface (CSI). In some embodiments, CSI host 1112 may comprise a deserializer (DES), and CSI device 1141 may comprise a serializer (SER). A DSI host 1111 of application processor 1110 may perform a serial communication with a DSI device 1151 of display device 1150 via a display serial interface (DSI).

In some embodiments, DSI host 1111 comprises a serializer, and DSI device 1151 comprises a deserializer. Computing system 1100 may further comprise a radio frequency (RF) chip 1160 performing communication with application processor 1110. A physical layer (PHY) 1113 of computing system 1100 and a physical layer (PHY) 1161 of RF chip 1160 may perform data communications based on a MIPI DigRF. Application processor 1110 may further comprise a DigRF MASTER 1114 that controls the data communications of PHY 1161.

Computing system 1100 may further comprise a global positioning system (GPS) 1120, a storage 1170, a MIC 1180, a DRAM device 1185, and a speaker 1190. In addition, computing system 1100 may perform communications using an ultra wideband (UWB) 1120, a wireless local area network (WLAN) 1220, a worldwide interoperability for microwave access (WIMAX) 1130, etc. Other structures and interfaces of electric device 1000 may also be used.

The data loading circuit according to example embodiments of the inventive concept may be applied in various devices and systems requiring the loading process of the non-volatile data. Particularly the data loading circuit may be applied usefully in a high-density memory device and a system comprising the high-density memory device requiring the loading process of a large amount of the non-volatile data.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A data loading circuit, comprising:
   a non-volatile memory configured to store non-volatile data and output a serial data signal based on the stored non-volatile data in response to a power-up operation;
   a deserializer configured to receive the serial data signal and output multiple data bits at intervals of a unit period based on the received serial data signal;
   a load controller configured to generate multiple loading selection signals that are sequentially activated one-by-one at each interval of the unit period; and
   a loading memory unit configured to sequentially store the data bits at each interval of the unit period in response to the loading selection signals.

2. The data loading circuit of claim 1, wherein the deserializer comprises M flip-flops that are cascade-coupled (M>1) and the M flip-flops form a shift register circuit to provide M data bits through output nodes of the M flip-flops.

3. The data loading circuit of claim 2, wherein the loading memory unit has a storage capacity for M*N data bits that are provided from the deserializer for N times the unit period (N>1).

4. The data loading circuit of claim 2, wherein the loading memory unit comprises multiple loading units configured to receive the loading selection signals, respectively, the loading units being enabled sequentially one-by-one at the intervals of the unit period in response to the loading selection signals.

5. The data loading circuit of claim 2, wherein the unit period comprises a shifting period during which the shift register circuit performs a shifting operation to store the M data bits in synchronization with a transfer clock signal and a loading period during which the loading memory unit receives and stores the M data bits from the shift register circuit.

6. The data loading circuit of claim 5, wherein the transfer clock signal is activated during the shifting period and deactivated during the loading period, and the loading selection signals are activated sequentially one-by-one during the loading periods.

7. The data loading circuit of claim 5, wherein the shifting operation of the shift register circuit and an output operation of the non-volatile memory are performed in synchronization according to the transfer clock signal.

8. The data loading circuit of claim 1, wherein the non-volatile memory comprises:
   a fuse array comprising multiple fuse cells configured to store the non-volatile data; and
   a serializer configured to serialize the non-volatile data from the fuse array to output the serial data signal.

9. The data loading circuit of claim 8, wherein the non-volatile data comprises fail addresses indicating locations of fail memory cells in a semiconductor memory device, and the deserializer and the loading memory unit are included in a repair control circuit configured to perform a repair operation on the fail memory cells.

10. A method of operating a semiconductor device comprising a non-volatile memory and a data loading circuit, comprising
    detecting a power-up operation of the semiconductor device;
    in response to the power-up operation, outputting, by the non-volatile memory, a serial data signal based on stored non-volatile data;
    deserializing the serial data signal and outputting multiple data bits at intervals of a unit period based on the received serial data signal;
    generating multiple loading selection signals that are sequentially activated one-by-one at each interval of the unit period; and
    sequentially storing the data bits at each interval of the unit period in a loading memory unit in response to the loading selection signals.

11. The method of claim 10, wherein deserializing the serial data signal comprises storing the serial data signal in M flip-flops that are cascade-coupled (M>1) and form a shift register circuit to provide M data bits through output nodes of the M flip-flops.

12. The method of claim 11, wherein the loading memory unit has a storage capacity for M*N data bits that are provided from the deserializer for N times the unit period (N>1).

13. The method of claim 11, wherein the loading memory unit comprises multiple loading units configured to receive the loading selection signals, respectively, the loading units being enabled sequentially one-by-one at the intervals of the unit period in response to the loading selection signals.

14. The method of claim 11, wherein the unit period comprises a shifting period during which the shift register circuit performs a shifting operation to store the M data bits in synchronization with a transfer clock signal and a loading period during which the loading memory unit receives and stores the M data bits from the shift register circuit.

* * * * *